March 5, 1963 H. H. KOPPEL ET AL 3,080,531
D.-C. STABILIZING AMPLIFIER
Filed Oct. 30, 1958
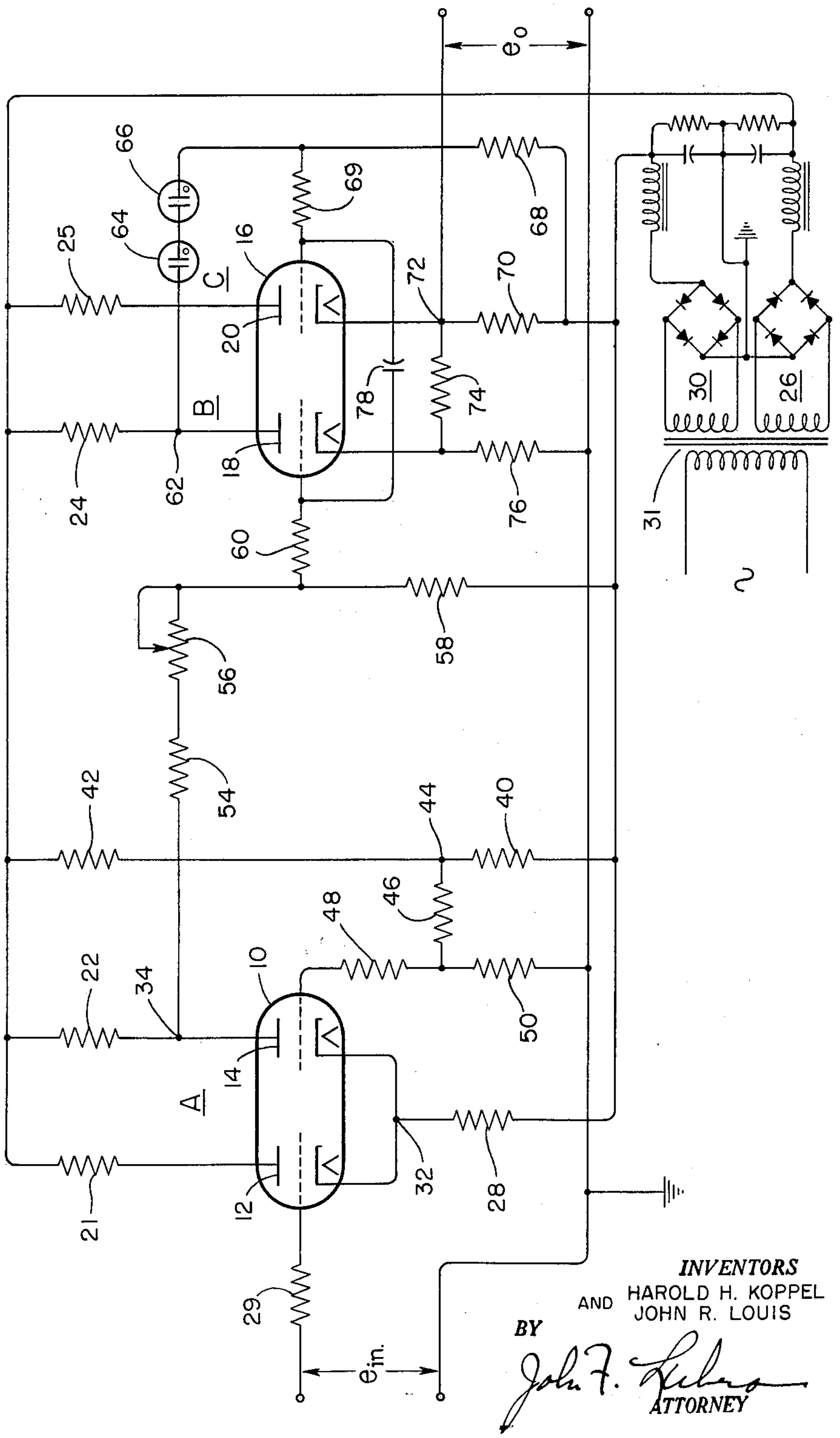
INVENTORS
HAROLD H. KOPPEL
AND
JOHN R. LOUIS
BY John F. [signature]
ATTORNEY United States Patent Office 3,080,531
Patented Mar. 5, 1963

3,080,531
D.-C. STABILIZING AMPLIFIER
Harold H. Koppel, South Euclid, and John R. Louis, Euclid, Ohio, assignors to Bailey Meter Company, a corporation of Delaware
Filed Oct. 30, 1958, Ser. No. 770,710
4 Claims. (Cl. 330—69)

This invention relates to D.-C. amplifying apparatus and more particularly to an improved D.-C. amplifier having high stability under variable conditions.

Our invention is particularly related to a plural stage D.-C. amplifier having high gain, high input impedance and low output impedance and of the type generally referred to as "operational" amplifiers such as employed in the computing art. As is well-known to those skilled in the art, such amplifiers are usually connected in a closed loop circuit having external feedback and external passive impedance elements which produce desired characteristics in the output signal.

Presently available D.-C. amplifying equipment capable of use in the computing and other applications is costly due to the accuracy required and the problems of stability in D.-C. amplification. It has been necessary to provide circuits which compensate for such factors as variations in supply voltage and variations in cathode emission of electronic tubes resulting in complicated amplifying circuits and power supply circuits which greatly influence the initial cost.

Perhaps the most serious problem connected with D.-C. amplification is that of zero drift of the output signal caused by variations in power supply voltages and variations in cathode emission. With zero input signal a change in the power supply voltage will result in a voltage appearing at the amplifier output terminals in addition to the normal output voltage thus producing an error in the output signal. Zero drift in the first stage of amplification is particularly undesirable since the error is amplified by the overall amplifier gain. Variations in cathode emission resulting from variations in filament voltage or variations in tube characteristics are also serious when occurring in the amplifier input stage and usually require the use of compensating circuits or frequent replacement of the tubes to minimize the condition.

It is a principal object of this invention to substantially eliminate zero drift in a D.-C. amplifier circuit.

Another object of the invention is to incorporate a low cost compensating circuit in the first stage of a D.-C. amplifier which compensates for the effect of power supply voltage variations in the first stage as well as in subsequent stages.

Another object of the invention is to provide an amplifier capable of operating from inexpensive power supplies without appreciable drift.

Another object of the invention is to provide a low cost D.-C. amplifier possessing a high degree of stability.

Other objects and advantages will become apparent from the following description taken in connection with the accompanying drawing which is a schematic circuit diagram of a D.-C. amplifier embodying this invention.

Referring now to the drawing, the amplifier consists of three amplifying stages indicated generally by the reference letters A, B, and C. The first or input stage A consists of a differential amplifier stage, while the second stage B comprises a simple triode amplifier stage. The third or output stage C comprises a cathode follower stage employed to transform the output impedance of the second stage B to a much lower value to provide a low amplifier output impedance. Internal regenerative feedback is employed between the output stage C and the second stage B to provide a high level of amplifier gain. A simple compensating circuit is provided in the first stage to compensate for zero drift due to variations in the power supply voltages.

Referring now to the particular circuitry employed, the amplifier circuit includes a twin triode vacuum tube 10 having two separate triode sections 12 and 14 and a second twin triode tube 16 having separate triode sections 18 and 20. The tubes 10 and 16 are of conventional construction, each triode section having an anode, a grid, and a cathode. The filaments for the cathodes are connected in a series circuit (not shown) across a suitable source of alternating voltage.

The anodes or plates of the triode sections 12, 14, 18, and 20 are connected through suitable anode resistors 21, 22, 24 and 25 respectively to a positive D.-C. power supply indicated at 26. The cathodes of the sections 12 and 14 are connected through a common cathode resistor 28 to a negative D.-C. power supply indicated at 30 which provides a direct voltage of the same order of magnitude as the power supply 26. The input signal $e_{in}$ to the amplifier is applied to the grid of triode section 12 through a resistor 29.

As illustrated in the drawing, the power supplies 26 and 30 each comprise a rectifier bridge circuit coupled to a secondary winding of a transformer 31 which has its primary winding energized by a suitable source of alternating voltage. It is a known fact that the D.-C. output voltages of such power supplies can vary in response to a number of conditions. For example, if the voltage of the A.-C. source should change, a variation in the outputs of both power supplies 26 and 30 will occur. In addition to this condition independent variation of the output of each power supply can occur as a result of variations in the characteristics of the various components. Thus, it is possible for both the negative and positive D.-C. voltages supplied to the amplifier circuit to vary together or independently. In the past such variations have been compensated for by complicated regulating circuits incorporated in the power supplies. With the present invention, however, the need for such regulating circuitry is eliminated as will presently be described.

The triode sections 12, 14, anode resistors 21, 22, cathode resistor 28, and power supplies 26, 30 form the differential amplifier input stage A of the amplifier circuit. In operation, if the grid of section 12 becomes more positive as a result of a change in the input signal $e_{in}$, the plate current of triode section 12 will increase, and as a result, a larger voltage drop will occur across the common cathode resistor 28. This increase in the voltage drop across resistor 28 is effective to cause the common junction at 32 of the cathodes to become more positive thereby decreasing the plate current in triode section 14 and causing the potential at terminal 34 to become more positive. The resistor 28 is effective to establish degenerative feedback in sections 12 and 14 to produce a linear relationship between the output potential at 34 and the input signal $e_{in}$.

If the amplification factor $u$ and plate resistance $r_p$ of the tube 10 are high, the output voltage at terminal 34 may be expressed mathematically by the following approximate equation:

$$e_{34}=\frac{uR_{21}}{2(R_{21}+r_p)}(e_{in}-e_2)$$

where $e_2$ is the potential of the grid of triode section 14 and $R_{21}$ is the resistance of resistor 21. From the above equation it can be seen that the output voltage at terminal 34 is approximately proportional to the difference between the voltages applied to the grid of triode section 12 and grid of triode section 14.

The differential amplifier stage A is self-compensating for individual variations in cathode emission of the sections 12, 14 such as caused by variations in filament voltage, changing tube characteristics, etc. through the provision of the common cathode resistor 28. For example, an increase in cathode emission of triode section 12 will result in a decrease in the effective resistance of this section causing its anode to become more negative. However, the increase in plate current in section 12 as the result of the increase in emission will increase the voltage drop across the cathode resistor 28 causing the grid cathode voltage of triode section 14 to become more negative to drive its anode potential more positive to counteract the original change in potential. It will be apparent that the circuit will respond in an opposite sense to counteract a change in cathode emission of triode section 14.

As will later be described, the differential input stage A is effective in combination with the other stages to produce compensation for the condition wherein the voltages of both power supplies 26, 30 change simultaneously due to a variation in voltage of the A.-C. source. It will also be described that different conditions are established when the voltages of the power supplies 26, 30 vary independently of each other. To compensate for the latter effect, a compensating circuit is associated with the differential amplifier input stage A to compensate the output potential at terminal 34 for the effect of independent voltage variations of the power supplies 26, 30 on the input stage as well as on the other stages B and C. The compensating circuit comprises a voltage divider network including a pair of resistors 40, 42 connected in series between the two power supplies 26, 30 and having a common junction 44 which is normally at zero or ground potential when the positive and negative voltages of the two power supplies are equal. The common junction 44 is connected by resistor 46 to the common junction of a pair of resistors 48, 50 connected in series between the grid of triode section 14 and ground.

The above circuit including resistors 40, 42, 46, 48 and 50 is effective to apply a voltage to the grid of triode section 14 to cause a change in potential at terminal 34 to compensate for the effect of variation in voltage of one of the power supplies 26, 30 on the input stage A and on the other stages of the circuit as will later be described in more detail.

The output terminal 34 of the differential amplifier stage A is connected by means of an inter stage coupling circuit to the grid of the triode section 18 which forms the second amplifier stage B. The output of the second stage B is fed into the cathode follower output stage C which is formed by triode section 20 and associated circuitry. The coupling circuit comprises a voltage divider resistance network formed by resistors 54, 56, 58 connected in series between the output terminal 34 and the negative power source 30. A resistor 60 connects the common junction of the resistors 56, 58 with the grid of the triode section 18. This coupling circuit is effective to reduce the voltage level or potential at terminal 34 to approximately zero potential for application to the grid of triode section 18 to achieve linear operation of the amplifier stage B. If the total resistance of the resistors 54, 56 is small, the gain of the inner stage coupling network will be close to unity.

A signal applied to the grid of triode section 18 will result in an amplified output signal at terminal 62 in the plate circuit thereof opposite in phase to the potential at terminal 34. The potential at terminal 62 of the amplifier stage B may be expressed mathematically by the following equation:

$$e_{62}=\frac{(uR_{24})}{r_p+R_{24}}e_{in2}$$

where $u$ is the amplification factor as before, $R_{24}$ is the resistance of resistor 24, $r_p$ is the plate resistance of triode section 18 and $e_{in2}$ is the voltage applied to the grid of triode section 18.

The output terminal of the second stage B is coupled to the grid of triode section 20 which forms the cathode follower output stage C of the circuit. This coupling comprises a voltage divider consisting of two low impedance glow discharge tubes such as neon bulbs 64, 66 connected in series with a resistor 68 between the terminal 62 and power supply 26, the grid of section 20 being connected to the common junction of the neon bulb 66 and resistance 68 by a resistor 69. This coupling has a particular advantage in that it provides the voltage drop necessary for proper bias of the cathode follower output stage, but due to the low impedance of neon bulbs, the gain of the coupling network is maintained at approximately unity. The voltage gain of this network may be expressed mathematically as follows:

$$e_2=\left(\frac{R_{68}}{2R_{ne}+R_{68}}\right)e_{in3}$$

where $e_{in3}$ is the input voltage to the coupling network, $R_{68}$ is the resistance of resistor 68, and $R_{ne}$ is the resistance of each neon bulb.

The cathode follower output stage C is employed to produce a low amplifier output impedance and to establish internal regenerative feedback to the second stage B. In addition the stage C produces an output voltage of reversible polarity.

The function of the resistor 25 in the cathode follower stage C is to limit the plate current in section 20 in conjunction with the resistor 69 when the amplifier output terminals are shorted out. At this shorted condition, the resistor 69 prevents the grid from becoming positive relative to the cathode to thereby limit the grid current and maintain the same at zero potential while the resistor 25 limits the plate current flow at zero grid to cathode potential.

The cathode of the triode section 20 is connected to the negative voltage supply 30 through a resistor 70, the output $e_o$ of the entire amplifier being taken from a terminal 72 in the cathode circuit. With this arrangement, a bridge circuit is established in which the two power supplies form two bridge arms, the triode section 20 and resistor 25 form a third bridge arm, and the resistor 70 forms the fourth arm. The bridge output signal appears between terminal 72 and ground, the extent and direction of bridge unbalance being dependent on the resistance of triode section 20 which in turn is dependent on the input signal applied to the grid. Accordingly, through proper selection of the various components forming the cathode follower output stage C, an amplified output potential $e_o$ is produced at terminal 72 of reversible polarity.

Referring now to the feedback feature of the amplifier, the provision of resistor 76 in the cathode circuit of triode section 18 produces a degenerative effect on the amplification in stage B. As the input signal to the grid of section 18 becomes more positive, the plate current will increase resulting in an increase in the voltage drop across resistor 76. In effect this drives the cathode less negative to reduce the amplification of the stage.

Positive internal feedback is obtained between stages B and C by connecting the output terminal 72 through a resistor 74 to the cathode of triode section 18. The resistors 74 and 76 act as a voltage divider network applying the voltage produced across resistor 76 to the cathode of section 18. For example: If the output potential $e_o$ is changing in a negative direction the cathode of triode section 18 will be driven more negative to increase the plate current in section B. The increase in plate current in section B drives the potential at terminal 62 more negative which in turn drives the grid of the cathode follower stage C more negative to in effect cause the potential at terminal 72 to become more negative also. When the output potential is changing in a positive direction at terminal 72, the cathode of section 18 is driven more positive decreasing the plate current in this section and driving the potential at terminal 62 more positive to thus in turn cause the potential $e_o$ to become more positive.

The above described positive feedback effect is reduced by the degenerative effect in section 18 previously described to produce a net positive feedback regardless of the polarity of the output signal $e_o$. As a result the overall amplification of the circuit is substantially increased.

A capacitor 78 is connected between the grids of sections 18 and 20 to eliminate high frequency oscillation in stages B and C that may occur as a result of positive feedback.

*Operation*

To briefly summarize the operation of the amplifier, if the potential of the input signal $e_{in}$ should become more positive, the amplified output signal of stage A at terminal 34 will become more positive. The coupling circuit between stages A and B is effective to reduce the potential at terminal 34 to approximately zero potential for application to the grid of stage B.

Further amplification of the output signal of stage A occurs in stage B to produce a stage B output signal at terminal 62 opposite in polarity to the input signal $e_{in}$. The cathode follower output stage C is effective to transform the output impedance of the stage B to a much lower value and to establish an output signal $e_o$ at terminal 72 of reversible polarity. The gain of the amplifier is increased by the provision for positive feedback from stage C to stage B.

Referring now to the compensation feature of the invention, it was previously mentioned that two major conditions could exist causing variation of the voltages of power supplies 26, 30. One condition is where the A.-C. line voltage varies to affect the output voltage of both power supplies to the same degree, and the other condition is where the power supply voltages vary independently as a result of component aging or defective elements.

Considering first the condition of variation in the A.-C. source voltage, assume that an increase occurs causing the output of power supply 26 to become more positive and the output of power supply 30 to become more negative. In addition, since the filaments of each tube are energized by A.-C. voltage there will be a change in filament voltage and cathode emission in each triode section. Since the output voltage of both power supplies 26, 30 changes an equal amount, the voltage difference or potential at junction 44 will remain constant or zero if both power supplies have the same initial output voltage. Accordingly, the compensating network comprising resistors 40, 42, 44, 46, 48 and 50 is not responsive during variations in the voltages of both power supplies as a result of variations in the A.-C. source voltage.

It has been found that the above described condition of A.-C. source variation is compensated for by the particular arrangement of the general amplifier circuitry. More particularly, it will be noted that the variation in both power supply voltages and the filament voltages will in effect vary the plate current in each amplifier stage and would seemingly vary the output potential at each stage. This error is compensated for however by the fact that the variation in the negative supply voltage has a direct effect upon the grid voltage of stage B and by the fact that some degenerative action takes place in stage A due to the increased voltage drop across resistor 28. Since only negligible errors in the amplifier output potential are experienced during variations in the A.-C. source voltage, these various effects are believed to cancel out to produce a substantially constant output potential.

Referring now to the condition wherein the voltages of the power supplies vary independently due to component aging or other factors, it has been found that with this condition a substantial error is introduced in the amplifier output potential when the compensating network comprising resistors 40, 42, 44, 46, 48 and 50 is not employed. The magnitude of this error has been found to be the same for a predetermined change in either power supply voltage in either direction. It is believed that this error is due to the fact that a change in the voltage of only one power supply has a larger effect on the plate current in each amplifier stage and only a slight effect on other conditions such as grid-cathode voltage or vice versa depending on the particular power supply affected.

When the voltage output of one of the power supplies 26, 30 varies, however, with the provision of the compensating circuit the voltage difference of the two power supplies will produce a change in potential at the junction 44 resulting in the application of a more positive or negative signal to the grid of triode section 14 depending on the direction of the change and the particular power supply affected.

Since the compensating signal applied to the grid of triode section 14 is amplified in stage A as well as in subsequent stages, over compensation would occur if the potential at junction 44 were utilized directly. The voltage reducing network comprising resistors 46, 48, 50 is provided to reduce the potential at junction 44 and to produce the desired compensatory change in amplifier output for a predetermined change in voltage of one of the power supplies. If it should be so desired, the resistors 46 or 50 can be made adjustable to provide for accurate calibration of the compensating circuit.

While the invention is not limited in scope to the particular circuitry described, good results have been obtained with the circuit illustrated in the drawing when the various components were provided with the following values:

| | |
|---|---|
| Tube **10** | Type 5571. |
| Tube **12** | Type 5571. |
| Resistor **21** | 270K. |
| Resistor **22** | 300K. |
| Resistor **24** | 360K. |
| Resistor **25** | 27K. |
| Resistor **28** | 300K. |
| Resistor **29** | 500K. |
| Resistor **40** | 200K. |
| Resistor **42** | 200K. |
| Resistor **46** | 1.6M. |
| Resistor **48** | 500K. |
| Resistor **50** | 130K. |
| Resistor **54** | 2.224M. |
| Resistor **56** | 200 K. |
| Resistor **58** | 4.7M. |
| Resistor **60** | 500K. |
| Resistor **68** | 2M. |
| Resistor **69** | 500K. |
| Resistor **70** | 180K. |
| Resistor **74** | 150K. |
| Resistor **76** | 4.7K. |
| Power supply **26** | 250 volts. |
| Power supply **30** | +250 volts. |
| A.-C. power source | 115 volts, 60 cycle. |
| Capacitor **78** | .0011 mfd. |
| Neon bulb **64** | NE–2. |
| Neon bulb **66** | NE–2. |

The circuit illustrated in the drawing and composed of the above components was built and tested first with the resistors 40, 42, 44, 46, 48 and 50 forming the compensatory means disconnected from the circuit and then tested with this compensating means connected to determine the effect of voltage variations on the amplifier output with and without the compensating circuit. When the circuit was tested without compensation it was found that a 50 volt simultaneous change in the output of both power supplies (or 100 volt net change) due to A.-C. source variation produced only a 66 millivolt variation in the output voltage $e_o$. Independent variation of the power supply voltages to produce the same 100 volt net change was found to produce an error of approximately four volts. Thus, the error as a result of A.-C. source variation was negligible while an equivalent change due to independent variation of the power supplies produced an appreciable error.

When the circuit was tested with the compensating means connected, it was found that variation of the A.-C. source to effect the same 50 volt change in the output of both power supplies or a net change of 100 volts produced a negligible error in the same order of magnitude as before. However, when the power supply output voltages were varied independently to produce the same net voltage change, only a 40 millivolt error in the output potential was noticed. As this error is negligible, the circuit as compensated is substantially unaffected by variations in the power supply voltage due to either variation of the A.-C. source voltage or due to independent variation of each power supply voltage.

While only one embodiment of the invention has been herein shown and described, it will be apparent to those skilled in the art that many changes may be made in the construction and arrangement of parts without departing from the scope of the invention as defined in the appended claims.

What we claim as new and desire to secure by Letters Patent of the United States is:

1. In a D.-C. amplifier having means defining a positive direct voltage supply terminal and a negative direct voltage supply terminal with respect to ground potential, the combination comprising, a differential input stage of amplification including a pair of triode sections each having an anode, grid, and a cathode, a first pair of resistors connecting said anodes respectively to the positive supply terminal, an output terminal for said stage connected to the anode of one of said sections, a circuit for connecting said cathodes to the negative supply terminal, means for applying an input potential variable through a predetermined positive and negative range with respect to ground potential to the grid of the other of said sections, a second pair of resistors connected in series circuit across the positive and negative supply terminals and having a common junction, the potential of which is related to the voltage difference of the positive and negative supply terminals, and a voltage reducing circuit comprising a third pair of resistors connected in series between said grid of said one section and ground and a resistor connecting the common function of said third pair with said common junction of said second pair for applying a potential to the grid of said one section proportional to the difference between the voltages of the positive and negative supply terminals to compensate the output potential at said output terminal for variations in voltage of the positive and negative supply terminals.

2. A D.-C. amplifier as claimed in claim 1 further including a second stage of amplification responsive to the output of said differential input stage, and a third stage of amplification responsive to the output of said second stage, said third stage comprising a cathode follower output stage.

3. A D.-C. amplifier as claimed in claim 2 further including an internal positive feedback circuit between the cathode of said third stage and the cathode of said second stage.

4. A D.-C. amplifier as claimed in claim 3 further including a coupling circuit connecting said second and third stages comprising a voltage dividing network having a pair of glow discharge tubes connected in series with a resistor to produce a low impedance coupling circuit.

References Cited in the file of this patent

UNITED STATES PATENTS

| | | |
|---|---|---|
| 1,690,881 | Thilo | Nov. 6, 1928 |
| 2,185,367 | Blumlein | Jan. 2, 1940 |
| 2,581,456 | Swift | Jan. 2, 1952 |
| 2,717,353 | Sewell et al. | Sept. 6, 1955 |
| 2,751,496 | Giacoletto | June 19, 1956 |
| 2,762,965 | Walker | Sept. 11, 1956 |
| 2,781,419 | Ragni | Feb. 12, 1957 |
| 2,796,468 | McDonald | June 18, 1957 |
| 2,846,522 | Brown | Aug. 5, 1958 |
| 2,863,122 | Finket et al. | Dec. 2, 1958 |
| 2,903,524 | Howell | Sept. 8, 1959 |
| 2,926,309 | Norris | Feb. 23, 1960 |
| 2,946,016 | Meyer | July 19, 1960 |

FOREIGN PATENTS

| | | |
|---|---|---|
| 823,936 | France | Oct. 25, 1937 |
| 865,125 | Great Britain | Apr. 12, 1961 |